US012604445B2

(12) United States Patent
Rock

(10) Patent No.: US 12,604,445 B2
(45) Date of Patent: Apr. 14, 2026

(54) ELECTROMAGNETIC FIELD (EMF)-BLOCKING DEVICE FOR ELECTRICAL FIXTURES

(71) Applicant: Evan Blazso Rock, Papaikou, HI (US)

(72) Inventor: Evan Blazso Rock, Papaikou, HI (US)

( * ) Notice: Subject to any disclaimer, the term of this patent is extended or adjusted under 35 U.S.C. 154(b) by 110 days.

(21) Appl. No.: 18/885,580

(22) Filed: Sep. 14, 2024

(65) Prior Publication Data

US 2026/0082528 A1     Mar. 19, 2026

(51) Int. Cl.
*H05K 9/00*       (2006.01)
*H01R 13/443*     (2006.01)
*H02G 3/14*       (2006.01)

(52) U.S. Cl.
CPC ......... *H05K 9/0018* (2013.01); *H01R 13/443* (2013.01); *H02G 3/14* (2013.01)

(58) Field of Classification Search
CPC ....... H02G 3/14; H01R 13/443; H05K 9/0018
See application file for complete search history.

(56) References Cited

U.S. PATENT DOCUMENTS 5,285,014 A * 2/1994 Gilchrist .............. H01R 13/443
                                                            174/67
6,051,788 A * 4/2000 Nichols ................ H01R 13/443
                                                            174/67

6,364,673 B1 * 4/2002 Lee .................... H01R 13/4532
                                                            174/67
9,509,080 B1 * 11/2016 Insalaco ................. H01R 24/30
10,587,067 B2 * 3/2020 Lager .................... H01R 13/447
2001/0042751 A1 * 11/2001 Hurst ................... H05K 9/0016
                                                            220/241
2014/0113468 A1 * 4/2014 McBane ............. H01R 13/443
                                                            439/148
2017/0133829 A1 * 5/2017 Caporale ................. H01B 3/42
2021/0367369 A1 * 11/2021 Thompson ............... H02G 3/14
2024/0047914 A1 * 2/2024 Workman ........... H01R 13/447

* cited by examiner

*Primary Examiner* — Hung V Ngo
(74) *Attorney, Agent, or Firm* — Novel Patent Services LLC

(57)                ABSTRACT

An electromagnetic fields (EMF)-blocking device for blocking electromagnetic fields emitted from an electrical fixture, for example, an electrical socket. The EMF-blocking device comprises a cover body, at least one prong, and an insulated layer. The cover body is adapted to cover the electrical fixture. The prong is extended from a rear surface of the cover body, and is configured to insert into at least one hole of the electrical fixture to attach the cover body over the electrical fixture. The cover body is configured to be compatible with standard electrical fixtures. The insulated layer is disposed on the rear surface of the cover body, thereby contacting to a surface of the electrical fixture for blocking EMFs emitted from the electrical fixture. The EMF-blocking device is designed for simple, tool-free installation, allowing users to easily affix to any standard electrical fixture without requiring professional assistance.

12 Claims, 4 Drawing Sheets

100

106
108
110
102
104
104

100

106
104
104

ELECTROMAGNETIC FIELD (EMF)-BLOCKING DEVICE FOR ELECTRICAL FIXTURES

FIELD OF INVENTION

The present disclosure relates generally to an insulation accessory of electrical fixtures, and more particularly to a simple, cost-effective, and efficient EMF-blocking device that can be easily integrated into existing electrical fixtures without using tools and adhesives, to block EMF without compromising functionality or aesthetics.

BACKGROUND

Electromagnetic fields (EMFs) are generated by various electrical devices and infrastructure, including common household outlets. With the increasing proliferation of electronic devices, concerns have risen regarding the potential health impacts of long-term exposure to EMF. As awareness grows, there is a demand for practical solutions to minimize EMF exposure in everyday environments, particularly in homes and offices where people spend significant amounts of time.

Electrical fixtures, a ubiquitous component of modern living spaces, are a consistent source of EMF emissions. These fields can extend into the surrounding area, potentially exposing individuals to harmful radiation, especially when outlets are located near frequently occupied spaces such as beds, desks, and seating areas. Although EMF emissions from a single outlet might be low, cumulative exposure over time can be significant, leading to increased health concerns. Thus, there is a need for an effective, simple solution to block or reduce EMF emissions from electrical fixtures.

Several technologies and methods have been developed to address EMF exposure. These include EMF shielding paints, faraday cages, EMF reducing fabrics, plug-in EMF neutralizers.

The EMF shielding paints are special paints containing conductive materials are applied to walls to block or reduce EMF penetration from external sources, including electrical fixtures. The faraday cages are metal enclosures or mesh materials designed to block EMF by creating a barrier around electronic devices or areas. However, EMF shielding paints and faraday cages are expensive and require significant installation effort, making them impractical for widespread or everyday use.

The EMF reducing fabrics are fabrics embedded with conductive fibers can be draped over specific areas to block EMF radiation. However, the EMF reducing fabrics and paints are often limited to specific areas and are not practical for covering or protecting all electrical fixtures in a home or office environment.

The plug-in EMF neutralizers are devices that plug into electrical fixtures, claiming to neutralize or harmonize EMF radiation emitted from the outlet. However, the effectiveness of plug-in EMF neutralizers is often questioned, with little scientific evidence supporting their claims. Additionally, these devices do not physically block EMF but instead claim to alter its properties, which may not satisfy all users.

Despite the availability of various EMF reduction technologies, several issues persist. The existing EMF reduction technologies are complex and expensive. Further, the existing EMF reduction technologies has limited applicability and effectiveness. Many existing solutions are visually intrusive or inconvenient, affecting the aesthetics of a living space or requiring constant adjustment, which can be a deterrent to regular use.

Therefore, there is a need for a simple, cost-effective, and efficient EMF-blocking device that can be easily integrated into existing electrical fixtures to block EMF without compromising functionality or aesthetics.

SUMMARY OF THE INVENTION

The following presents a simplified summary of one or more embodiments of the present disclosure to provide a basic understanding of such embodiments. This summary is not an extensive overview of all contemplated embodiments and is intended to neither identify key nor critical elements of all embodiments, nor delineate the scope of any or all embodiments.

The present disclosure, in one or more embodiments, relates to a simple, cost-effective, and efficient electromagnetic field (EMF)-blocking device that can be easily integrated into existing electrical fixtures, for example, electrical sockets or outlets to block EMF without compromising functionality or aesthetics.

In one embodiment of the first aspect, an electromagnetic field (EMF)-blocking device is provided to block electromagnetic fields emitted by electrical fixtures, such as outlets or sockets. The EMF-blocking device comprises a cover body, at least one prong, and an insulated layer. The cover body is adapted to enclose the electrical fixture. The prong is extended from a rear surface of the cover body. The prong is configured to insert into at least one hole of the electrical fixture to attach the cover body over the electrical fixture.

In one embodiment, the cover body is configured to be compatible with standard electrical fixtures. In one embodiment herein, the cover body is made of at least one of a non-conductive material includes plastic, rubber, ceramics, silicone, fiberglass, epoxy resin, and Teflon. In one embodiment herein, the EMF-blocking device comprises a set of prongs. In one embodiment herein, the least one prong is made of an insulating material includes at least one of plastic, rubber, ceramics, silicone, fiberglass, epoxy resin, and Teflon. In one embodiment herein, the EMF-blocking device comprises a set of prongs.

The insulated layer is disposed on the rear surface of the cover body, thereby contacting with a surface of the electrical fixture for providing a protective barrier while effectively enclosing the electrical fixture. The insulated layer is configured for blocking the electromagnetic fields (EMFs) emitted from the electrical fixture.

In one embodiment, the insulated layer comprises at least one of an insulated metal sheet and an insulated metal mesh. In one embodiment, the insulated metal sheet having a thin metal sheet, which is completely encased in an insulating medium, thereby effectively preventing accidental electrical contacts and enhancing safety during use. In one embodiment herein, the insulated metal sheet having a thickness of at least, but not limited to, 0.5 mm.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

The accompanying drawings, which are incorporated in and constitute a part of the specification, illustrate an embodiment of the invention, and, together with the description, explain the principles of the invention.

DETAILED DESCRIPTION

Figure 1A:
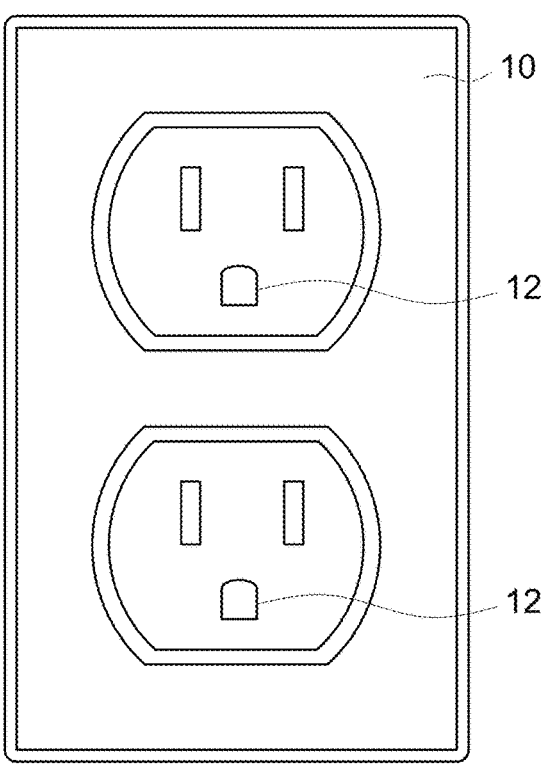
FIG. 1A illustrates a front view of a standard electrical fixture without an electromagnetic field (EMF)-blocking device, in accordance with embodiments of the invention.

Reference will now be made in detail to the present preferred embodiments of the invention, examples of which are illustrated in the accompanying drawings. Wherever possible, the same reference numerals are used in the drawings and the description to refer to the same or like parts.

FIG. 1A refers to a front view of an electrical fixture 10 without an electromagnetic field (EMF)-blocking device 100. In one embodiment herein, the EMF-blocking device 100 is configured to effectively block the electromagnetic fields, which are emitted by an electrical fixture, for example, an electrical outlet or socket. The EMF-blocking device 100 is a simple, cost-effective, and efficient device that can be removably affixed to existing electrical fixtures to block the EMF without the need for any installation and compromising functionality or aesthetics. The EMF-blocking device 100 comprises a cover body 102, at least one prong 104, and an insulated layer 106. The cover body 102 is adapted to completely enclose the electrical fixture 10. The prong 104 is extended from a rear surface of the cover body 102. The prong 104 is configured to insert into at least one hole 12 of the electrical fixture 10 to attach the cover body 102 over the electrical fixture 10.

In one embodiment herein, the EMF-blocking device 100 can be customized in a variety of shapes and sizes, allowing it to be compatible with a wide range of electrical fixtures 10. This flexibility in design ensures that the EMF-blocking device 100 can be tailored to fit different types of electrical fixtures, such as outlets, switches, or sockets, making it suitable for diverse applications in residential, commercial, or industrial applications.

Figure 1B:
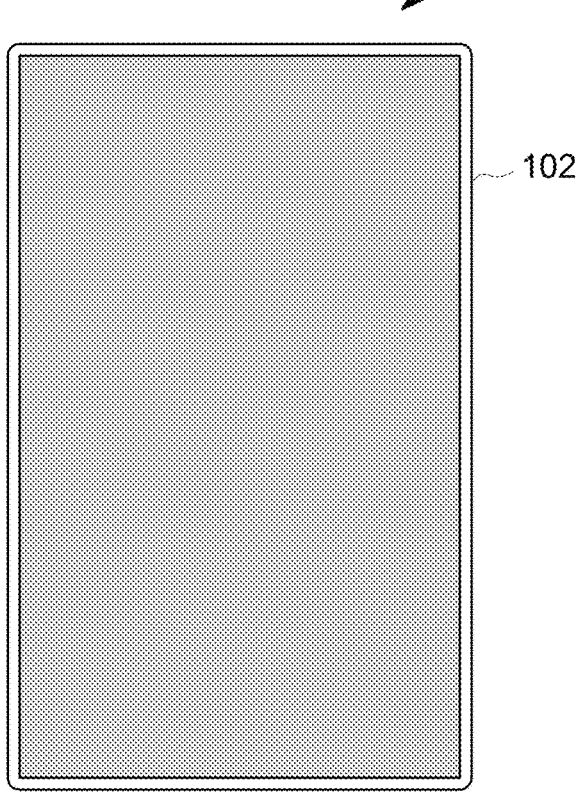
FIG. 1B illustrates a front view of the EMF-blocking device, in accordance with embodiments of the invention.

FIG. 1B refers to a front view of the EMF-blocking device 100. In one embodiment, the cover body 102 is configured to be compatible with any standard electrical fixtures 10. In one embodiment herein, the cover body 102 is made of at least one of a non-conductive material includes plastic, rubber, ceramics, silicone, fiberglass, epoxy resin, and Teflon. In one embodiment herein, the EMF-blocking device 100 comprises a set of prongs 104. In one embodiment herein, the least one prong 104 is made of an insulating material includes at least one of plastic, rubber, ceramics, silicone, fiberglass, epoxy resin, and Teflon.

Figure 1C:
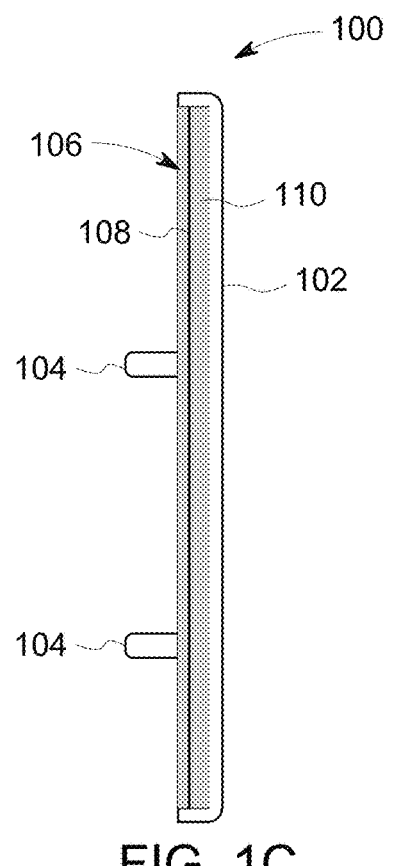
FIG. 1C illustrates a side view of the EMF-blocking device, in accordance with embodiments of the invention.

FIG. 1C refers to a side view of the EMF-blocking device 100. The insulated layer 106 is disposed on the rear surface of the cover body 102, thereby contacting with a surface of the electrical fixture 10 for providing a protective barrier while effectively enclosing the electrical fixture 10. The insulated layer 106 is configured for blocking the electromagnetic fields (EMFs) emitted from the electrical fixture 10.

In one embodiment, the insulated layer 106 comprises at least one of an insulated metal sheet 108. The insulated metal sheet 108 could be a thin metal sheet, which is completely encased in an insulating medium 110, such as plastic, rubber, or fiberglass, thereby effectively preventing accidental electrical contact and enhancing safety during use. In some embodiments, the insulated metal sheet 108 could be an insulated metal mesh. In one embodiment herein, the insulated metal sheet 108 having a thickness of at least, but not limited to, 0.5 mm.

Figure 1D:
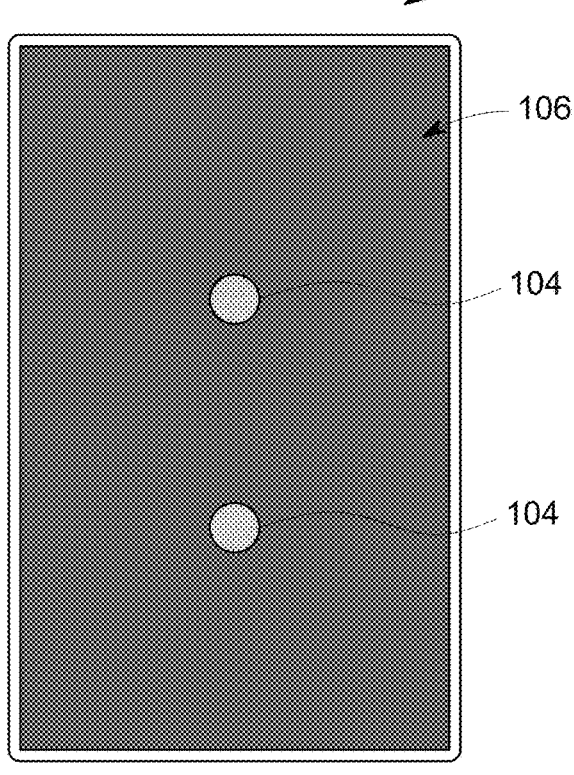
FIG. 1D illustrates a rear view of the EMF-blocking device, in accordance with embodiments of the invention.

FIG. 1D refers to a rear view of the EMF-blocking device 100. In one embodiment herein, the EMF-blocking device 100 ensures that the insulated layer 106 effectively blocks the electromagnetic fields (EMFs) emitted by the electrical fixture 10, thereby minimizing exposure to EMF radiation while the EMF-blocking device 100 is securely affixed to the electrical fixture 10.

The user can effortlessly attach and remove the EMF-blocking device 100 to and from the electrical fixture 10 by inserting the prong 104 of the device into the corresponding hole of the electrical fixture 10. Once the prong 104 is properly inserted, the insulated layer 106 of the EMF-blocking device 100 comes into direct contact with the surface of the electrical fixture 10.

The EMF-blocking device 100 provides a safer environment by minimizing potential health risks associated with prolonged EMF radiation exposure. The EMF-blocking device 100 is designed for simple, tool-free installation, allowing users to easily plug the EMF-blocking device 100 into any standard electrical fixture 10 without requiring professional assistance. This convenience ensures that the EMF-blocking device 100 is quickly and efficiently implemented in any home or office setting.

Unlike other EMF shielding technologies that can be expensive and labor-intensive, the EMF-blocking device 100 provides an affordable alternative that is accessible to a wide range of consumers, making EMF protection more attainable. The EMF-blocking device 100 integrates seamlessly with existing electrical fixtures, maintaining the aesthetic appeal of the living or working space. Its low-profile design ensures that the EMF-blocking device 100 does not detract from the room's decor or require additional space.

The EMF-blocking device 100 is designed to block EMF without interfering with the normal operation of the electrical fixture 10. Users can continue to use the electrical fixture 10 for powering multiple devices by removing the EMF-blocking device 100. The EMF-blocking device 100 is compatible with standard electrical fixtures, making it a versatile solution for various environments, including homes, offices, and other settings where EMF exposure may be a concern.

The EMF-blocking device 100 is built with high-quality materials that offers robust and enduring protection against electromagnetic fields (EMF) without the need for frequent replacements. The EMF-blocking device 100 does not require any power source or maintenance, providing a passive solution to EMF reduction that works continuously without any user intervention. As a non-electronic device, the EMF-blocking device 100 has a minimal environmental footprint, contributing to sustainable practices by reducing the need for electronic EMF neutralizers and their associated energy consumption. The simplicity and effectiveness of the EMF-blocking device 100 make it suitable for scaling across multiple outlets in a building, allowing for comprehensive EMF protection throughout a space.

In one embodiment herein, the EMF-blocking device 100 could be paintable in a variety of colors, allowing for customization to seamlessly integrate with the aesthetic of the room. This feature enables the EMF-blocking device 100 to blend in with the surrounding décor, offering both functionality and visual appeal without disrupting the overall design of the space. By providing the option to match the EMF-blocking device 100 with different color schemes, it enhances its versatility and appeal for use in homes, offices, or other environments where maintaining a cohesive look is important.

Figure 2A:
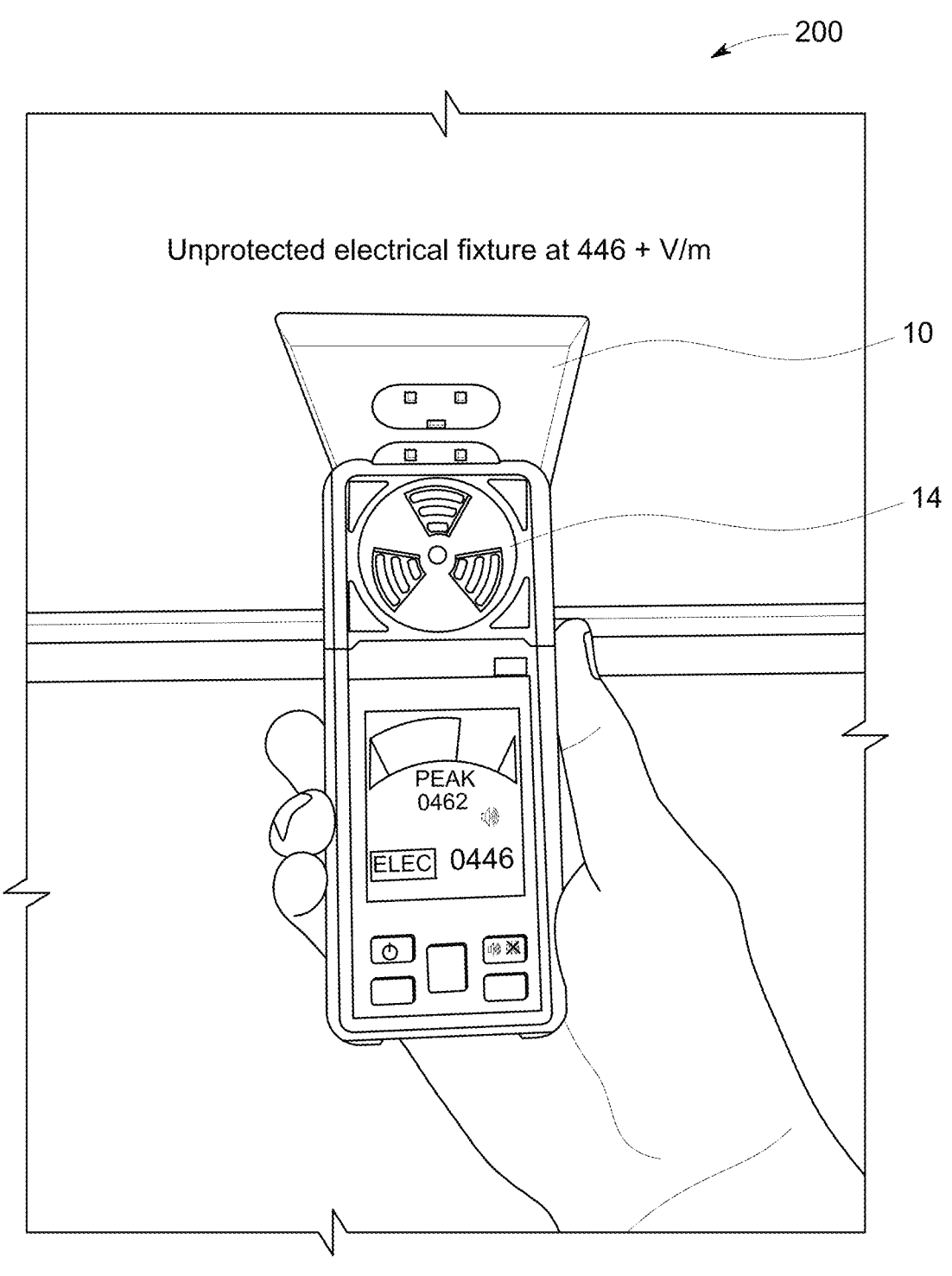
FIG. 2A illustrates an image depicting an EMF measuring device measuring the EMF emitted by an unprotected electrical fixture without the EMF-blocking device, in accordance with embodiments of the invention.

FIG. 2A illustrates an image 200 depicting an EMF measuring device 14 measuring the EMF emitted by an unprotected electrical fixture 10 without the EMF-blocking device 100. The EMF measuring device 14 displays a reading of 446+ V/m, indicating a significant level of electromagnetic radiation emitted from the unprotected electrical fixture 10. The EMF measuring device's display is likely red, signifying a high EMF reading.

Figure 2B:
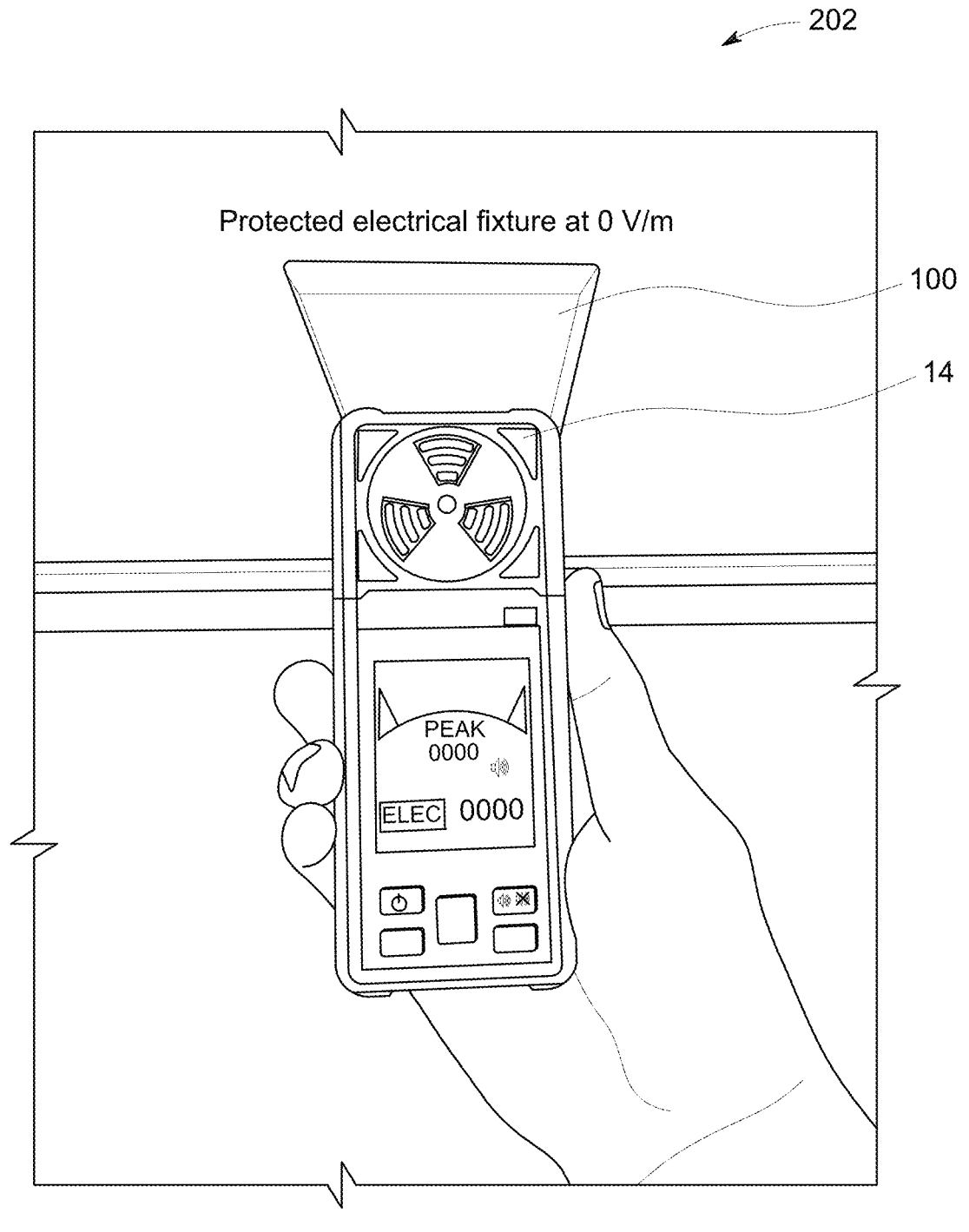
FIG. 2B illustrates an image depicting the EMF measuring device measuring EMF emitted by a protected electrical fixture with the EMF-blocking device, in accordance with embodiments of the invention.

FIG. 2B illustrates an image 202 depicting the EMF measuring device 14 measuring EMF emitted by a protected electrical fixture with the EMF-blocking device 100. The EMF measuring device 14 displays a reading of 0 V/m, indicating a negligible level of electromagnetic radiation from the protected electrical fixture. The EMF measuring device's display is likely green, signifying a low or undetectable EMF reading. Since the EMF-blocking device 100 fully encloses the electrical fixture 10, there are no potential pathways for EMF leakage. Consequently, the EMF measuring device 14, positioned anywhere on the protected fixture, will detect negligible EMF readings.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principles of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

It will readily be apparent that numerous modifications and alterations can be made to the processes described in the foregoing examples without departing from the principles underlying the invention, and all such modifications and alterations are intended to be embraced by this application.

The claimed invention is:

1. An electromagnetic field (EMF)-blocking device, comprising:
   a cover body adapted to enclose an electrical fixture;
   at least one prong extended from a rear surface of the cover body, wherein the at least one prong is configured to insert into at least one hole of the electrical fixture to attach the cover body over the electrical fixture; and
   an insulated layer disposed on the rear surface of the cover body, thereby contacting with a surface of the electrical fixture for providing a protective barrier while effectively enclosing the electrical fixture, wherein the insulated layer is configured for blocking electromagnetic fields (EMFs) emitted from the electrical fixture.

2. The EMF-blocking device of claim 1, wherein the cover body is made of at least one of a non-conductive material includes plastic, rubber, ceramics, silicone, fiberglass, epoxy resin, and Teflon.

3. The EMF-blocking device of claim 1, wherein the least one prong is made of an insulating material includes at least one of plastic, rubber, ceramics, silicone, fiberglass, epoxy resin, and Teflon.

4. The EMF-blocking device of claim 1, wherein the insulated layer comprises at least one of an insulated metal sheet and an insulated metal mesh.

5. The EMF-blocking device of claim 4, wherein the insulated metal sheet having a thin metal sheet, which is completely encased in an insulating medium, thereby effectively preventing accidental electrical contact and enhancing safety during use.

6. The EMF-blocking device of claim 4, wherein the insulated metal sheet having a thickness of at least 0.5 mm.

7. The EMF-blocking device of claim 1, wherein the EMF-blocking device is configured to be compatible with standard electrical fixtures.

8. An electromagnetic field (EMF)-blocking device, comprising:
   a cover body adapted to enclose an electrical fixture;
   at least one prong extended from a rear surface of the cover body, wherein the at least one prong is configured to insert into at least one hole of the electrical fixture to attach the cover body over the electrical fixture; and
   an insulated layer disposed on the rear surface of the cover body, thereby contacting with a surface of the electrical fixture for providing a protective barrier while effectively enclosing the electrical fixture,
   wherein the insulated layer is configured for blocking electromagnetic fields (EMFs) emitted from the electrical fixture,
   wherein the insulated layer comprises an insulated thin metal sheet, which is completely encased in an insulating medium, thereby effectively preventing accidental electrical contact and enhancing safety during use.

9. The EMF-blocking device of claim 8, wherein the cover body is made of at least one of a non-conductive material includes plastic, rubber, ceramics, silicone, fiberglass, epoxy resin, and Teflon.

10. The EMF-blocking device of claim 8, wherein the least one prong is made of an insulating material includes at least one of plastic, rubber, ceramics, silicone, fiberglass, epoxy resin, and Teflon.

11. The EMF-blocking device of claim 8, wherein the EMF-blocking device is configured to be compatible with standard electrical fixtures.

12. The EMF-blocking device of claim 8, wherein the insulated metal sheet having a thickness of at least 0.5 mm.

* * * * *